United States Patent
Mu et al.

(10) Patent No.: US 9,629,246 B2
(45) Date of Patent: Apr. 18, 2017

(54) PCB BASED SEMICONDUCTOR PACKAGE HAVING INTEGRATED ELECTRICAL FUNCTIONALITY

(71) Applicant: Infineon Technologies AG, Neubiberg (DE)

(72) Inventors: Qianli Mu, San Jose, CA (US); Cristian Gozzi, Santa Clara, CA (US); Michael Simcoe, S. San Francisco, CA (US); Guillaume Bigny, San Jose, CA (US)

(73) Assignee: Infineon Technologies AG, Neubiberg (DE)

( * ) Notice: Subject to any disclaimer, the term of this patent is extended or adjusted under 35 U.S.C. 154(b) by 75 days.

(21) Appl. No.: 14/811,325

(22) Filed: Jul. 28, 2015

(65) Prior Publication Data

US 2017/0034913 A1   Feb. 2, 2017

(51) Int. Cl.
| | |
|---|---|
| *H05K 7/00* | (2006.01) |
| *H05K 1/11* | (2006.01) |
| *H05K 1/18* | (2006.01) |
| *H05K 1/02* | (2006.01) |
| *H01L 23/14* | (2006.01) |

(52) U.S. Cl.
CPC ........... *H05K 1/181* (2013.01); *H05K 1/0298* (2013.01); *H05K 1/111* (2013.01); *H05K 1/115* (2013.01); *H01L 23/142* (2013.01); *H05K 1/182* (2013.01); *H05K 2201/09327* (2013.01); *H05K 2201/09336* (2013.01); *H05K 2201/10166* (2013.01)

(58) Field of Classification Search
CPC ........ H05K 1/181; H05K 1/182; H05K 1/183; H05K 2201/09327; H05K 2201/09336; H05K 2201/09345; H01L 23/142
USPC .......................................... 361/760, 764, 783
See application file for complete search history.

(56) References Cited

U.S. PATENT DOCUMENTS 3,986,196 A * 10/1976 Decker .................... H01L 23/36
                                                          257/276
5,438,478 A   8/1995 Kondo et al.
(Continued)

FOREIGN PATENT DOCUMENTS

| CN | 101553918 A | 10/2009 |
|---|---|---|
| DE | 10223035 A1 | 12/2003 |

(Continued)

*Primary Examiner* — Binh Tran
(74) *Attorney, Agent, or Firm* — Murphy, Bilak & Homiller, PLLC

(57) ABSTRACT

A semiconductor package includes a metal baseplate, a semiconductor die having a reference terminal attached to the baseplate and an RF terminal facing away from the baseplate, and a multilayer circuit board having a first side attached to the baseplate and a second side facing away from the baseplate. The multilayer circuit board includes a plurality of interleaved signal and ground layers. One of the signal layers is at the second side of the multilayer circuit board and electrically connected to the RF terminal of the semiconductor die. One of the ground layers is at the first side of the multilayer circuit board and attached to the metal baseplate. Power distribution structures are formed in the signal layer at the second side of the multilayer circuit board. RF matching structures are formed in a different one of the signal layers than the power distribution structures.

24 Claims, 12 Drawing Sheets

(56) References Cited

U.S. PATENT DOCUMENTS

| | | | |
|---|---|---|---|
| 5,728,248 A | | 3/1998 | Weber |
| 5,776,512 A | * | 7/1998 | Weber ............... B29C 45/14655 |
| | | | 249/91 |
| 5,798,014 A | | 8/1998 | Weber |
| 5,843,808 A | | 12/1998 | Karnezos |
| 5,973,389 A | | 10/1999 | Culnane et al. |
| 6,261,868 B1 | | 7/2001 | Miller et al. |
| 6,329,713 B1 | * | 12/2001 | Farquhar ........... H01L 23/49816 |
| | | | 257/678 |
| 6,511,866 B1 | | 1/2003 | Bregante et al. |
| 7,298,046 B2 | | 11/2007 | Venegas et al. |
| 7,582,964 B2 | | 9/2009 | Venegas et al. |
| 8,013,429 B2 | | 9/2011 | Mohammed et al. |
| 8,907,467 B2 | | 12/2014 | Komposch et al. |
| 2003/0151128 A1 | | 8/2003 | Kawaguchi |
| 2015/0048492 A1 | | 2/2015 | Komposch et al. |

FOREIGN PATENT DOCUMENTS

| | | |
|---|---|---|
| DE | 102010038246 A1 | 8/2011 |
| EP | 2575167 A2 | 4/2013 |
| JP | H10242377 A | 9/1998 |
| JP | 2003179181 A | 6/2003 |

* cited by examiner

PCB BASED SEMICONDUCTOR PACKAGE HAVING INTEGRATED ELECTRICAL FUNCTIONALITY

TECHNICAL FIELD

The present application relates to RF power packages, in particular PCB (printed circuit board) based packages RF power applications.

BACKGROUND

Ceramic air-cavity and plastic air-cavity/overmold packages are widely used for RF/microwave discrete power transistors. Both types of packages provide a reliable and easy-to-handle handle mechanical design. However, ceramic air-cavity and plastic air-cavity/overmold packages are difficult to design in an electrical sense due to their stack-up and predetermined physical dimensions.

SUMMARY

According to an embodiment of a semiconductor package, the semiconductor package comprises a metal baseplate having a die attach region and a peripheral region, a transistor die having a reference terminal attached to the die attach region and an RF terminal facing away from the baseplate, and a multilayer circuit board having a first side attached to the peripheral region and a second side facing away from the baseplate, the multilayer circuit board comprising a plurality of interleaved signal and ground layers. A first one of the signal layers is at the second side of the multilayer circuit board and electrically connected to the RF terminal of the transistor die. A first one of the ground layers is below the first signal layer. A second one of the signal layers is below the first ground layer and electrically connected to the first signal layer by insulated vias which extend through the first ground layer. A second one of the ground layers is at the first side of the multilayer circuit board and attached to the metal baseplate.

According to another embodiment of a semiconductor package, the semiconductor package comprises a metal baseplate, a semiconductor die having a reference terminal attached to the baseplate and an RF terminal facing away from the baseplate, and a multilayer circuit board having a first side attached to the baseplate and a second side facing away from the baseplate. The multilayer circuit board comprises a plurality of interleaved signal and ground layers. One of the signal layers is at the second side of the multilayer circuit board and electrically connected to the RF terminal of the semiconductor die. One of the ground layers is at the first side of the multilayer circuit board and attached to the metal baseplate. Power distribution structures are formed in the signal layer at the second side of the multilayer circuit board. RF matching structures are formed in a different one of the signal layers than the power distribution structures.

According to an embodiment of a semiconductor assembly, the semiconductor assembly comprises a substrate and a semiconductor package attached to the substrate. The semiconductor package comprises a metal baseplate, a semiconductor die having a reference terminal attached to the baseplate and an RF terminal facing away from the baseplate, and a multilayer circuit board having a first side attached to the baseplate and a second side facing away from the baseplate. The multilayer circuit board comprises a plurality of interleaved signal and ground layers. One of the signal layers is at the second side of the multilayer circuit board and electrically connected to the RF terminal of the semiconductor die. One of the ground layers is at the first side of the multilayer circuit board and attached to the metal baseplate. Power distribution structures are formed in the signal layer at the second side of the multilayer circuit board. RF matching structures are formed in a different one of the signal layers than the power distribution structures.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Described next are embodiments of a PCB (printed circuit board) based power semiconductor package in which the package also is treated as part of the electrical design of the system instead of a just a mechanical component. Doing so provides flexibility into the design, improves integration, and enhances performance while providing a more compact physical size. By combining the concept of a discrete package with a sub-system module in an electrical design sense, design flexibility is still realized while also boosting the electrical performance of the system and reducing the final circuit physical dimensions.

The embodiments described herein provide a multilayer organic PCB based package for high design integration. The PCB has a minimum of four layers, two of which are ground layers. Signal and ground layers can be interleaved to reduce interference and improve performance. RF matching and power distribution and combining structures can be formed in one or more signal layers of the PCB. For example, integrated harmonics resonators for providing harmonics termination can be formed in one or more of the signal layers of the PCB to provide high efficiency power amplifier class functionality. A balanced power combiner network can be formed in one or more of the signal layers of the PCB to provide uniform power distribution across a large die periphery or large pad dimension. In addition or alternatively, the PCB based package can have interleaved ground-signal-ground pad connections for providing a high frequency and high reliability electrical contact between the PCB based package and another circuit board.

Figure 1:
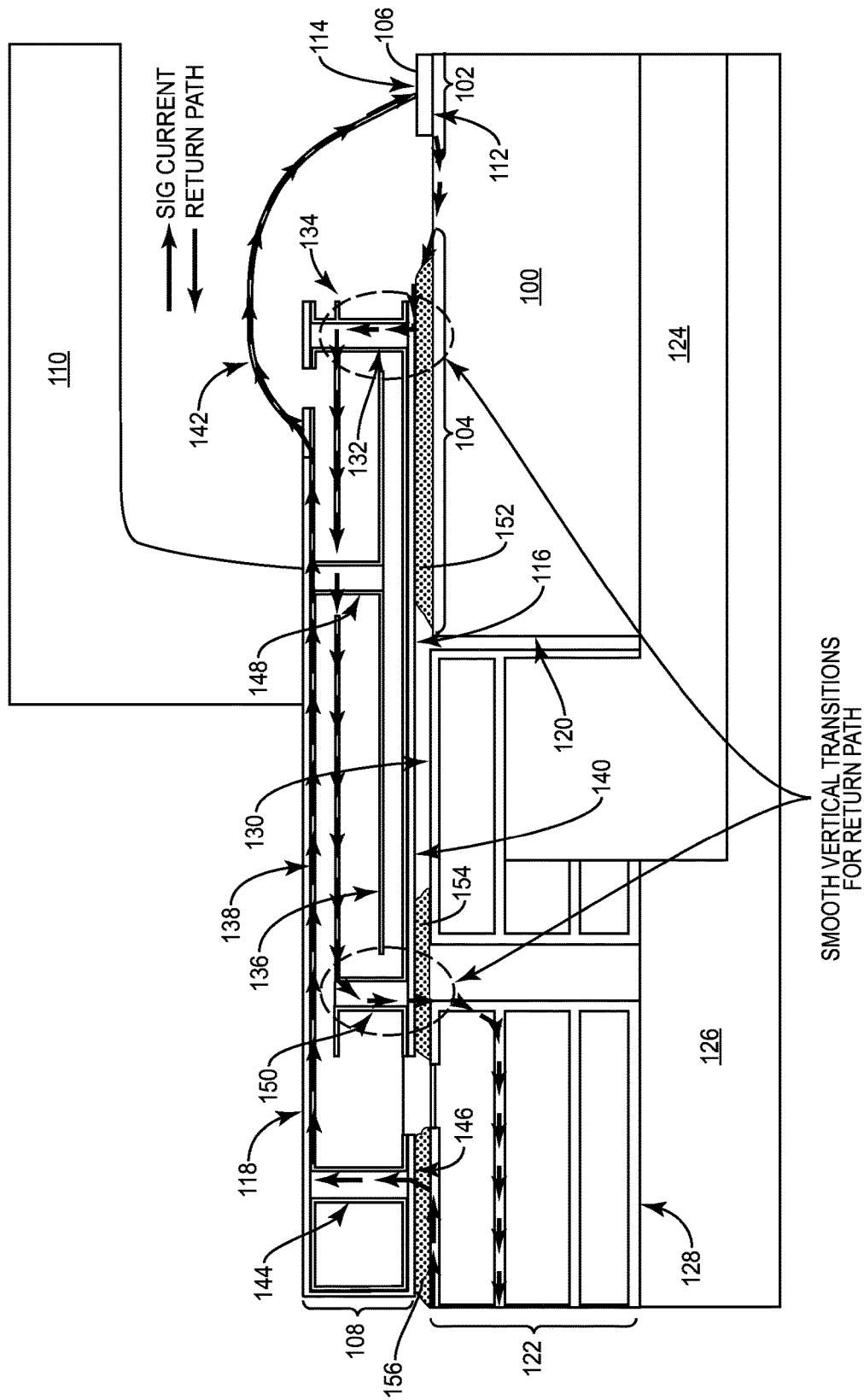
FIG. 1 illustrates a partial section view of a semiconductor package having a multi-layer circuit board.

FIG. 1 illustrates a partial sectional view of a semiconductor package, according to an embodiment. The power semiconductor package comprises a metal baseplate 100 having a die attach region 102 and a peripheral region 104, a transistor die 106 attached to the die attach region 102 of the baseplate 100, a multilayer circuit board 108 such as a PCB for providing electrical connections to the transistor die 106, and an optional lid 110 for enclosing the transistor die 106. The baseplate 100 is made of an electrically and thermally conductive material such as Cu, CPC (copper, copper-molybendum, copper laminate structure), CuW, etc. In some cases, the transistor die 106 attached to the baseplate 100 is a power transistor die such as an RF amplifier die. For example, the transistor die 106 can be an LDMOS (laterally diffused metal oxide semiconductor), vertical power MOSFET (metal oxide semiconductor field effect transistor) or GaN RF power transistor die. The transistor die 106 has a reference terminal 112 such as a source or emitter terminal attached to the die attach region 102 and an RF terminal 114 such as a drain or collector terminal facing away from the baseplate 100. The control (gate) terminal of the transistor die is out of view in FIG. 1. More than one transistor die can be attached to the baseplate 100 e.g. in the case of a Doherty amplifier in which a main and one or more peaking amplifiers can be attached to the baseplate 100.

In general, the multilayer circuit board 108 has a first side 116 attached to the peripheral region 104 of the baseplate 100 and a second side 118 facing away from the baseplate 100. The multilayer circuit board 108 extends beyond an exterior sidewall 120 of the baseplate 100 for attachment to another circuit board 122. The other circuit board 122 belongs to a sub-system or system that incorporates the semiconductor package. This circuit board 122 can have a recessed region for receiving the baseplate 100 of the semiconductor package. A metal slug 124 can be disposed in the recess for enhancing the thermal and electrical interface with the baseplate 100 of the semiconductor package. A heatsink 126 comprising e.g. aluminum of copper can be attached to the backside 128 of the additional circuit board 122.

The part of the multilayer circuit board 108 which extends beyond the exterior sidewall 120 of the baseplate 100 is attached to the front side 130 of the other circuit board 122. The multilayer circuit board 108 of the semiconductor package comprises a plurality of interleaved signal and ground layers. The example shown in FIG. 1 has four layers: two ground layers 132, 134 and two signal layers 136, 138 which are interleaved with one another. In general, the multilayer circuit board 108 can have two or more signal layers and two or more ground layers. The bottommost layer 132 is a ground layer having ground pads 140 which are attached to both the baseplate 100 of the semiconductor package and to the other circuit board 122. That is, the ground pads 140 of the bottommost layer 132 of the multilayer circuit board 108 are attached to the metal baseplate 100 and also extend beyond the exterior sidewall 120 of the baseplate 100 for attachment to the other circuit board 122.

The uppermost layer 138 of the multilayer circuit board 108 forms the main RF signal layer of the semiconductor package and is electrically connected to the RF terminal 114 of the transistor die 106 by one or more electrical conductors 142 such as one or more bond wires, ribbons, a metal clip, etc. The main RF signal layer 138 also can be electrically connected to the front side 130 of the other circuit board 122 through insulated signal vias 144 which extend through the multilayer circuit board 108 to signal pads 146 formed in the bottommost ground layer 132 of the multilayer circuit board 108. The signal pads 146 at the bottommost ground layer 132 are positioned beyond the exterior sidewall 120 of the baseplate 100 and separated from the ground pads 140 at the bottommost layer 132 to ensure proper electrical isolation.

An intermediary ground layer 134 is disposed below the main RF signal layer 138, and an intermediary signal layer 136 is disposed below this ground layer 134 and above the bottommost ground layer 132. The intermediary signal layer 136 is electrically connected to the main RF signal layer 138 by insulated signal vias 148 which extend through the ground layer 134 interposed between the intermediary signal layer 136 and the main RF signal layer 138. In a similar manner, the ground layers 132, 134 are electrically connected by insulated ground vias 150. The multilayer circuit board 108 can have additional interleaved ground and signal layers if desired.

Figure 2A:
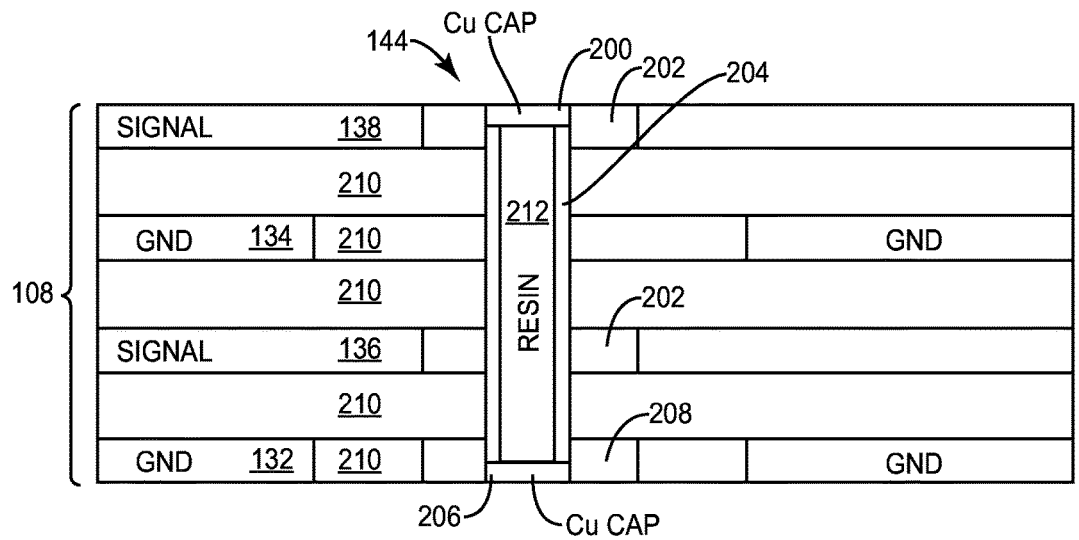
FIGS. 2A and 2B illustrate different embodiments of signal via structures for the multi-layer circuit board shown in FIG. 1.

FIG. 2A illustrates a sectional view of an embodiment of one of the insulated signal vias 144 for electrically connecting the uppermost signal layer 138 of the multilayer circuit board 108 over the entire thickness of the multilayer circuit board 108. According to this embodiment, the insulated signal via 144 comprises a cap 200 such as a copper cap in the case of copper vias and a top pad 202 adjacent the cap 200 in the uppermost signal layer 138. A plated-through hole 204 extends vertically through the multilayer circuit board 108, optionally contacting one or more intermediary signal layers 136 via a corresponding buried pad 202. The bottom of the insulated signal via 144 comprises a cap 206 such as a copper cap in the case of copper vias and a bottom pad 208 formed in the bottommost ground layer 132. The bottom cap 206 and pad 208 are electrically insulated from the ground metal tracks/pads of the bottommost ground layer 132 by a dielectric material 210 of the multilayer circuit board 108 such as polytetrafluoroethylene, FR-1, FR-2, FR-3, FR-4, FR-5, FR-6, G-10, CEM-1, CEM-2, CEM-3, CEM-4, CEM-5, etc. A non-conductive resin 212 can fill the plated-through holes 204. The ground vias 150 shown in FIG. 1 can have the same or similar construction as shown in FIG. 2A.

Figure 2B:
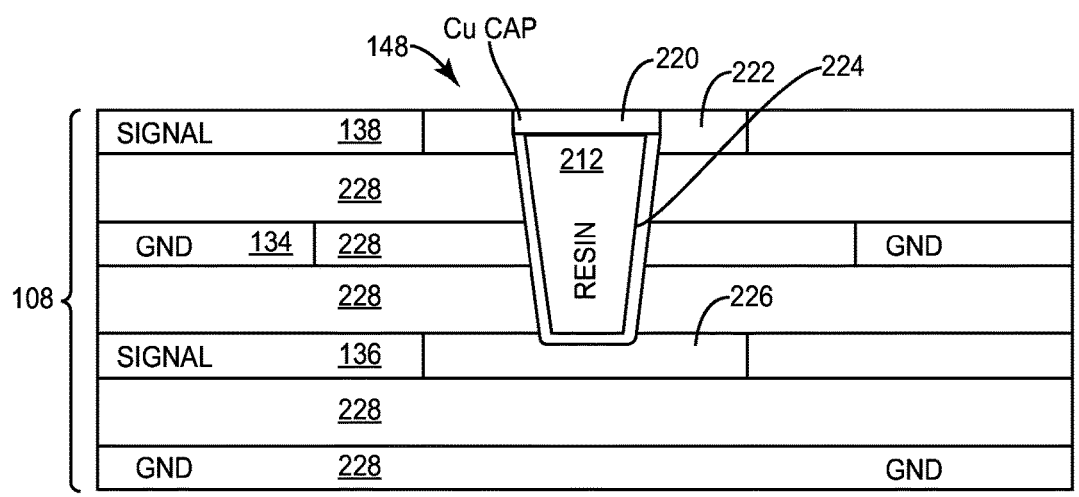

FIG. 2B illustrates a sectional view of an embodiment of one of the insulated signal vias 148 for electrically connecting the uppermost signal layer 138 of the multilayer circuit board 108 to an intermediary signal layer 136 buried in the multilayer circuit board 108, according to an embodiment. According to this embodiment, the insulated signal via 148 comprises a cap 220 such as a copper cap in the case of copper vias and a top pad 222 adjacent the cap 220 in the uppermost signal layer 138. A plated blind hole 224 vertically extends partly through the multilayer circuit board 108 to the intermediary signal layer 136. The bottom of the insulated signal via 148 comprises a pad 226 which contacts a signal metal track of the intermediary signal layer 136. The plated blind hole 224 is electrically insulated from the ground layer 134 in interposed between the uppermost signal layer 138 and the intermediary signal layer 136 by a dielectric material 228 such as the kind described above in connection with FIG. 2A.

By utilizing such a multi-layer circuit board construction, optimized electrical connections to each transistor die 106 included in the semiconductor package can be realized. For example in the case of the transistor die 106 being an RF high power amplifier die, the electromagnetic field propagation from the multilayer circuit board 108 of the semiconductor package to the subsystem/system circuit board 122 is critical for the high frequency performance of the power amplifier. The electromagnetic field propagation can be optimized to achieve high performance at high frequency. For example, the inductance of the signal vias 144, 148 is reduced with the presence of the ground vias 150. The ground vias 150 provide a smooth vertical transition for the RF return path, reducing the overall loop inductance of the signal vias 144, 148 which in turn reduces return losses. The RF signal current path is highlighted with right-facing arrows and the return path is highlighted with left-facing arrows in FIG. 1.

Figure 3A:
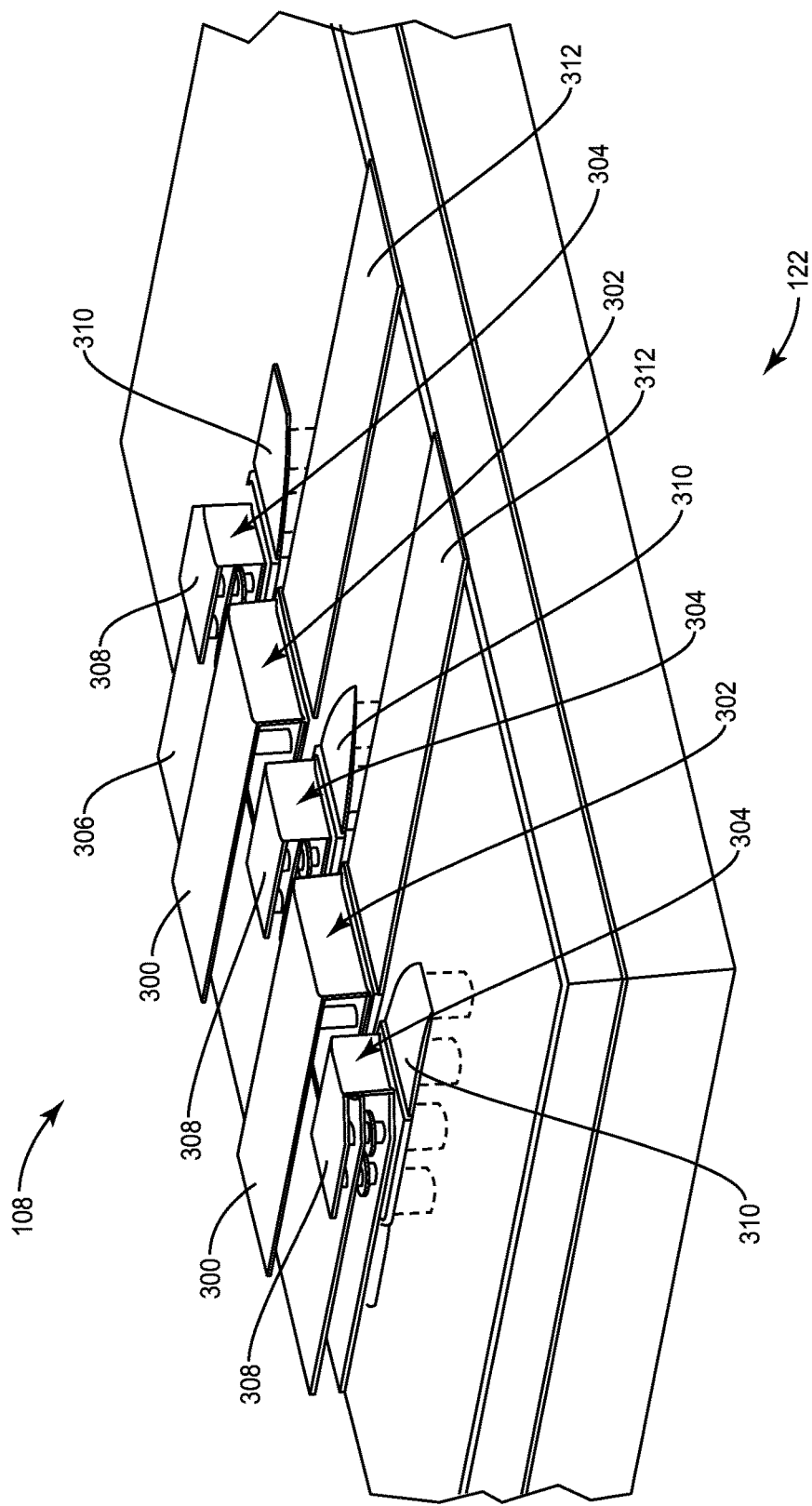
FIG. 3A illustrates a partial perspective of an interface between a multi-layer circuit board of a semiconductor package and a subsystem/system circuit board.

FIG. 3A illustrates an embodiment of the interface between the multi-layer circuit board 108 of the semiconductor package and the subsystem/system circuit board 122. The dielectric material of the multi-layer circuit board 108 is not shown in FIG. 3 so that the signal and ground metal tracks, and the signal and ground vias are each at least partly visible. According to this embodiment, the uppermost signal layer 138 of the multi-layer circuit board 108 comprises a plurality of signal metal tracks 300 such as microstrip lines which are electrically connected to respective signal pads 146 (out of view in FIG. 3A) at the bottom side of the multilayer circuit board 108 by insulated signal vias 302 which extend through the multilayer circuit board 108. Ground pads 140 (also out of view in FIG. 3A) at the bottom side of the multilayer circuit board 108 are separated from and interleaved with the signal pads 146. The ground pads 140 are electrically connected to the ground layers 132, 134 of the multi-layer circuit board 108 by insulated ground vias 304 which extend through the multilayer circuit board 108. The ground layers 132, 134 can each comprise a single metal sheet 306 as shown in FIG. 3, however, other configurations are possible such as multiple ground metal tracks such as multiple sheets or striplines. In addition or alternatively, ground metal tracks 308 can partly extend on the uppermost signal layer 138 in some embodiments. In each case, the subsystem/system circuit board 122 has interleaved ground and signal pads 310, 312 which correspond to the interleaved ground/signal pad configuration of the multi-layer circuit board 108 of the semiconductor package. The circuit boards 108, 122 can be soldered to one another at these connection points, e.g. by respective solder joints 152, 154, 156 as shown in FIG. 1.

Figure 3B:
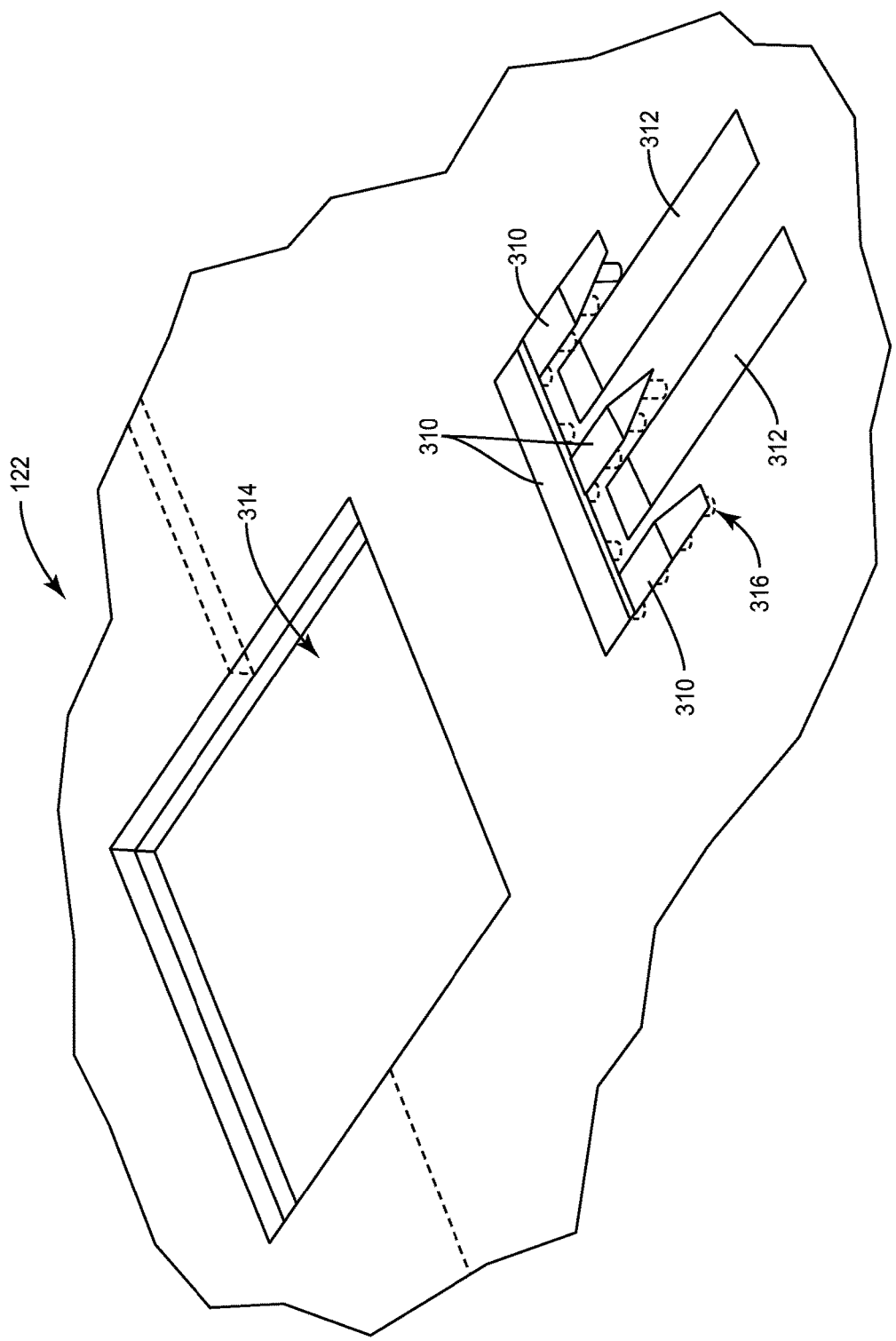
FIG. 3B illustrates a partial perspective of the subsystem/system circuit board of FIG. 3A prior to attachment of the semiconductor package having multi-layer circuit board.

FIG. 3B shows the subsystem/system circuit board 122 prior to placement and attachment of the semiconductor package. The subsystem/system circuit board 122 can have a recessed region 314 for receiving the baseplate 100 of the semiconductor package. The part of the multilayer circuit board 108 which extends beyond the exterior sidewall 120 of the baseplate 100 is shown in FIG. 3A and is attached to the front side of the subsystem/system circuit board 122 by the interleaved ground and signal pads 310, 312. The subsystem/system circuit board 122 can include insulated ground vias 316 for connecting to one or more other ground layers of the subsystem/system circuit board 122. Similar via connections can be made to the signal metal tracks of the system/system circuit board 122, but are not shown for ease of illustration. The interleaved ground-signal-ground configuration shown in FIGS. 3A and 3B provides for an efficient vertical propagation of the electric field between the multi-layer circuit board 108 of the semiconductor package and the subsystem/system circuit board 122.

In addition or alternatively to the interleaved ground-signal-ground configuration explained above, RF matching and power distribution and combining structures can be formed in the signal layers 136, 138 of the multi-layer circuit board 108 of the semiconductor package. This way, the multi-layer circuit board 108 can incorporate both mechanical and electrical functions into the design of the semiconductor package.

Figure 4:
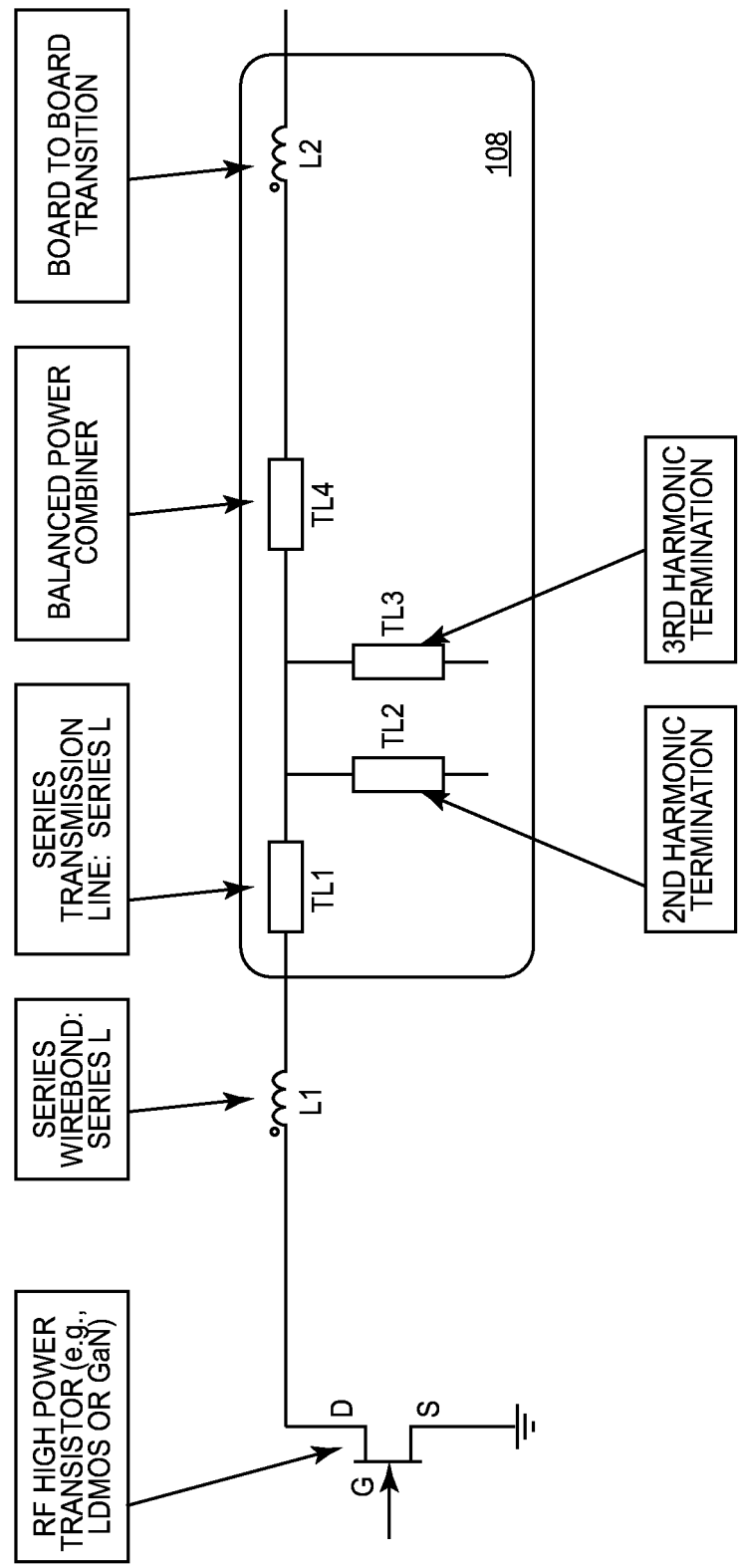
FIG. 4 illustrates a high-level schematic representation of different electrical functions at the output side of a semiconductor package having a multi-layer circuit board.

FIG. 4 illustrates a high-level schematic representation of different electrical functions at the output side of the semiconductor package which can be incorporated into the multi-layer circuit board 108. A single transistor component having a source terminal (S), drain terminal (D) and gate terminal (G) is shown, which can represent one or more physical transistor dies. In this example, the source terminal of the power transistor is electrically connected to ground through the bottommost layer 132 of the multi-layer circuit board 108 and the drain terminal of the power transistor is electrically connected to the uppermost signal layer 138 of the multi-layer circuit board 108 as previously described herein. The multi-layer circuit board 108 has one or more additional signal layers 136 interposed between the uppermost signal layer 138 and the bottommost ground layer 132. An additional ground layer 134 is interposed between vertically adjacent signal layers 136, 138 also as previously described herein. RF matching and power distribution and combining structures are formed in the signal layers 136, 138 of the multi-layer circuit board 108.

For example, the electrical connection between the drain terminal of the power transistor and the uppermost signal layer 138 of the multi-layer circuit board 108 is represented by inductance L1 in FIG. 4. The uppermost signal layer 138 of the multi-layer circuit board 108 can include a power distribution network represented by transmission line TL1. The power distribution network can be coupled to a harmonic termination resonator configured to capture spurious harmonics present in a signal at the RF terminal (e.g. drain) of the transistor. The harmonic termination resonator can include a $2^{nd}$ order harmonic termination resonator represented by transmission line TL2, a $3^{rd}$ order harmonic termination resonator represented by transmission line TL3, etc. The harmonic termination resonator can be formed in a different signal layer of the multi-layer circuit board 108 than the power distribution network. In addition to the power distribution network, the uppermost signal layer 138 can also include a balanced power combiner represented by transmission line TL4 for combining the output of the harmonic termination resonator. The electrical connection from the multi-layer circuit board 108 of the semiconductor package to the subsystem/system circuit board 122 is represented by inductance L2. The RF matching and power distribution and combining structures described above can be formed in the signal layers 136, 138 of the multi-layer circuit board 108.

Figure 5:
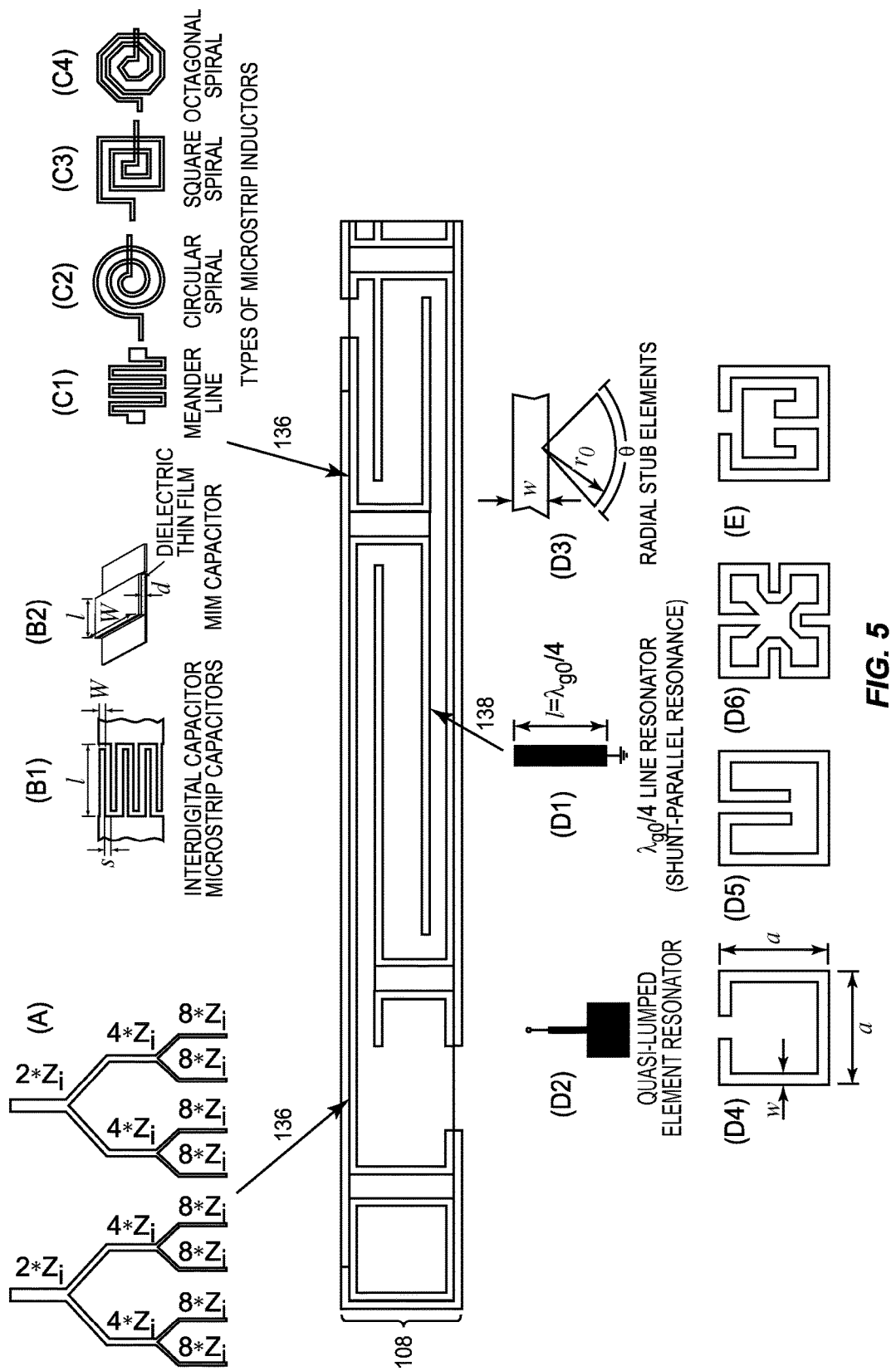
FIG. 5 illustrates a hybrid view of a multi-layer circuit board implemented with different electrical functions for the output side of a semiconductor package.

FIG. 5 illustrates a section view of the multi-layer circuit board 108 of the semiconductor package, with various schematic overlays showing exemplary types of RF matching and power distribution and combining structures which can be formed in the signal layers 136, 138 of the multi-layer circuit board 108. For example, a power combiner network (A) and integrated passive components such as output capacitors (B1, B2) and inductors (C1, C2, C3, C4) can be formed in metal tracks which are routed on the uppermost layer 138 of the multi-layer circuit board 108. The integrated passive components form a quasi-lumped transmission line device.

Integrated harmonic termination structures can be formed in one or more signal layers 136 below the uppermost signal layer 138 of the multi-layer circuit board 108 for capturing spurious harmonics present in a signal at the RF terminal of the transistor. For example, an open stub resonator (D1) with an electrical length equal to a quarter wavelength at 2fo ($2^{nd}$ harmonic termination) or at 3fo ($3^{rd}$ harmonic termination), a quasi-lumped resonator (D2), a radial stub resonator (D3), a square-open-loop-resonator (D4), a folded arm square-open-loop-resonator (D5), a meandering line square-open-loop-resonator (D6), a dual-mode square-open-loop-resonator (D7), etc. can be formed in one or more intermediary signal layers 136 of the multi-layer circuit board 108.

In one example, a square-open-loop-resonator can be used to design a quasi-elliptic low pass filter at the output with a high rejection at 2fo, allowing for an increase in the bandwidth of the power amplifier compared to a standard open stub resonator. Still other harmonic termination resonator types and configurations can be formed in the signal layer(s) 136 below the uppermost signal layer 138 of the multi-layer circuit board 108.

An impedance transformation network can be formed in the same or different intermediary signal layer as the harmonic termination resonator. The impedance transformation network is configured to transform a lower impedance at the RF terminal of the transistor to a higher impedance. In one embodiment, the impedance transformation network comprises a radial stub (D3) formed in one of the signal layers 136, 138. A ground layer 134 is interposed between vertically adjacent signal layers 136, 138 as previously described herein.

To achieve high power output, a wide finger length periphery is typically used for the transistor die 106. This means a large (wide) transistor die size. For example, a wide finger length periphery can be realized by a parallel arrangement of sub-unit cells each having a pre-defined periphery length for the same transistor die 106. The drain bond pad of a conventional transistor die is typically connected to a wide lead, resulting in high current density only on the edge of the lead which implies an unbalanced amplitude and phase shift between the unit cells of the same transistor die.

Figure 6:
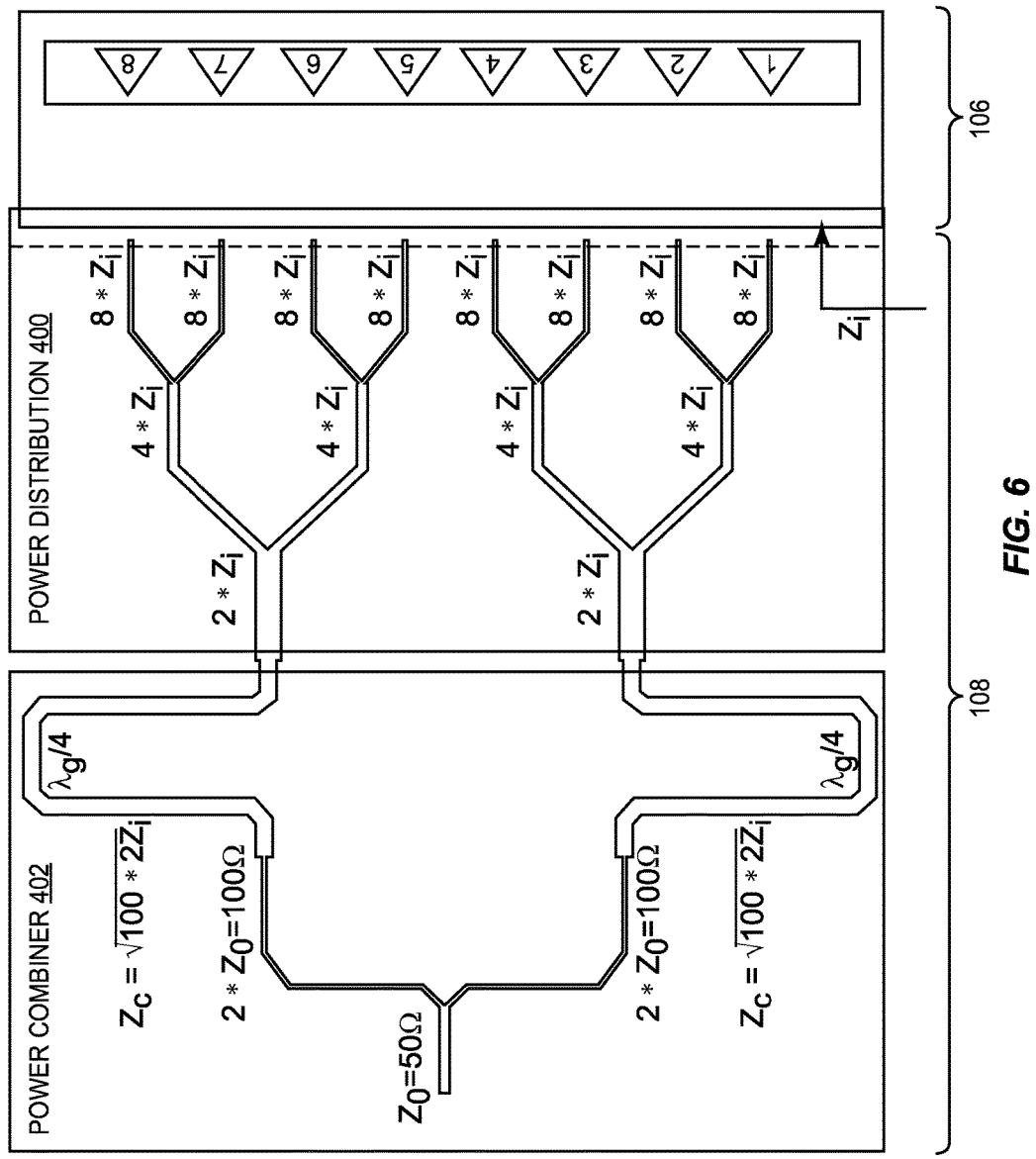
FIG. 6 schematically illustrates an embodiment of a multi-layer circuit board of a semiconductor package, implemented at the output side of the semiconductor package with a power distribution network and a balanced power combiner.

FIG. 6 schematically illustrates an embodiment of the multi-layer circuit board 108 of the semiconductor package, implemented at the output side of the semiconductor package with a power distribution network 400 and a balanced power combiner 402 formed in the uppermost signal layer 138 of the multi-layer circuit board 108. In this example, the transistor die 106 is shown with eight unit cells (1-8). Each unit cell contributes a portion of the overall transistor die signal capacity. The outputs of the unit cells are arranged in parallel. The uppermost signal layer 138 of the multi-layer circuit board 108 includes a separate metal signal track (8*Zi) for each unit cell output. The unit cell outputs can be electrically connected to the respective metal signal tracks by one or more electrical conductors such as one or more bond wires, ribbons, a metal clip, etc. In each case, the power distribution network 400 continues to fan in at different levels (e.g. from 8 tracks, to 4 tracks, to 2 tracks in this example), the metal signal tracks (X*Zi) in each level doubling in width from the previous level. The balanced power combiner 402 distributes current equally in amplitude and phase at each metal track (X*Zi) of the power distribution network 400. In FIG. 6, Zi represents the impedance looking into each unit cell of the transistor die 106 and Zo represents the impedance to which the output of the semiconductor package is to be matched (50Ω in this example).

Figure 7:
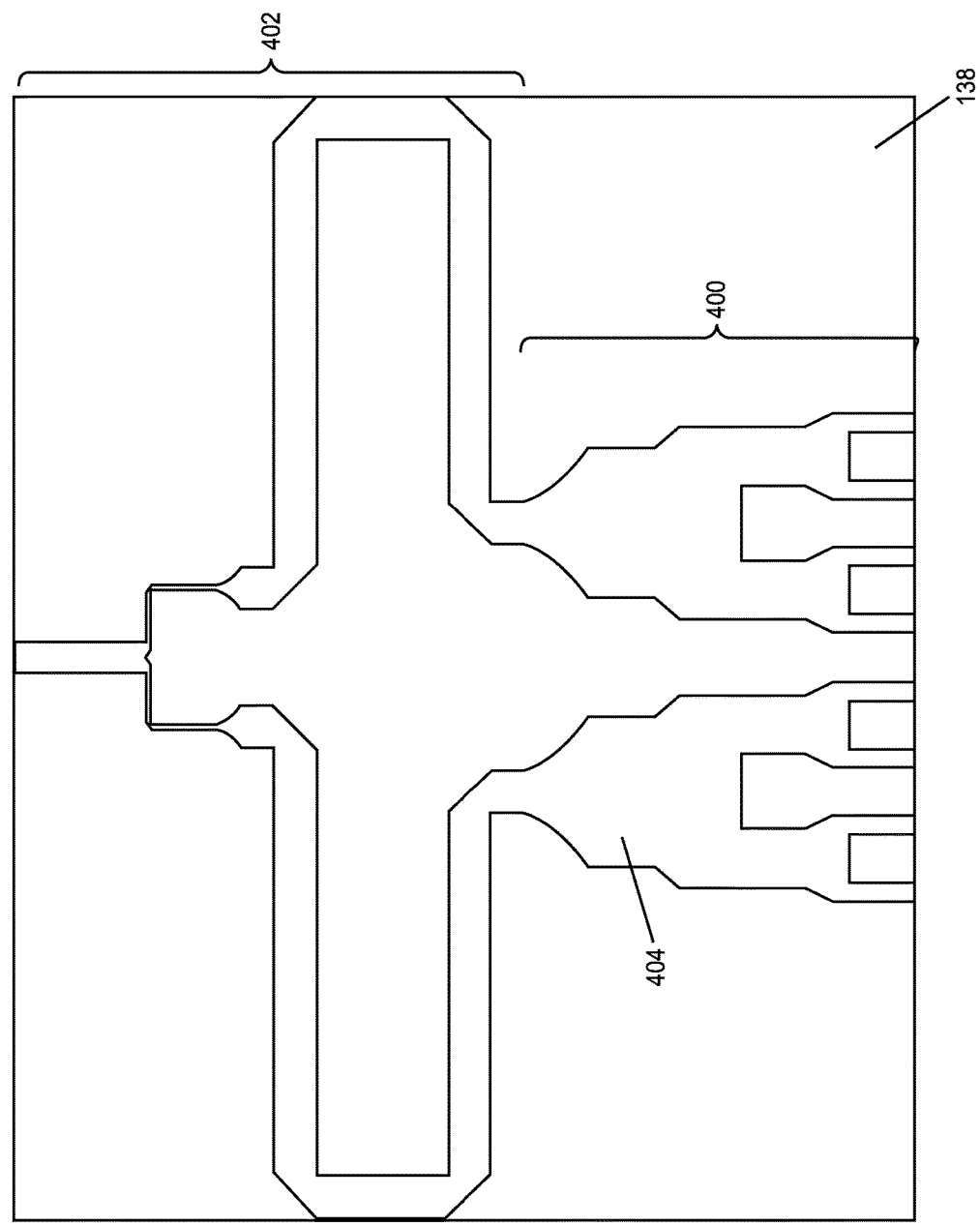
FIG. 7 illustrates a top down plan view of the uppermost signal layer of the multi-layer circuit board shown in FIG. 5, implemented with a power distribution network and a balanced power combiner.

FIG. 7 illustrates a top down plan view of the uppermost signal layer 138 of the multi-layer circuit board 108, implemented with the power distribution network 400 and the balanced power combiner 402 schematically shown in FIG. 6. The metal signal tracks formed in the uppermost signal layer 138 to realize the power distribution network 400 and the balanced power combiner 402 can comprise patterned copper metallization 404 in some embodiments.

Figure 8:
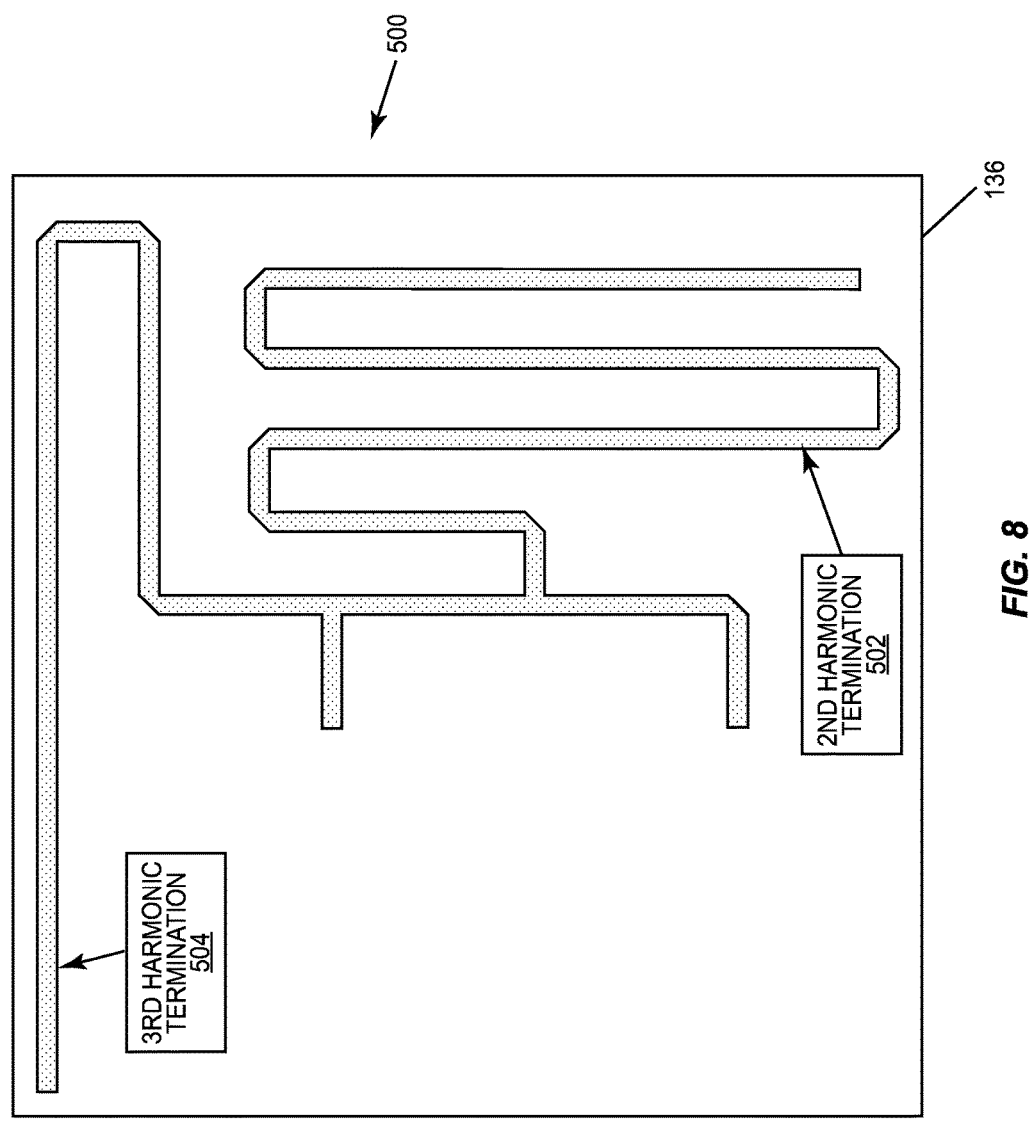
FIG. 8 schematically illustrates an embodiment of an intermediary signal layer of the multi-layer circuit board shown in FIG. 5, implemented with a harmonic termination resonator.

FIG. 8 schematically illustrates an embodiment of an intermediary signal layer 136 of the multi-layer circuit board 108, implemented with a harmonic termination resonator structure 500. The intermediary signal layer 136 is disposed below the uppermost signal layer 138 of the multi-layer circuit board 108. In this example, metal signal tracks are arranged to form a $2^{nd}$ harmonic termination structure 502 and a $3^{rd}$ harmonic termination structure 504 in the intermediary signal layer 136. A ground layer 134 can be interposed between the intermediary signal layer 136 with the harmonic termination resonator structure 500 and the uppermost signal layer 138. The harmonic termination resonator structure 500 can be electrically connected at one end to the power distribution network structure 400 formed in the uppermost signal layer 138 by a first group of insulated signal vias (not shown in FIG. 8), and electrically connected at another end to the balanced power combiner 402 formed in the uppermost signal layer 138 by a second group of insulated signal vias (also not shown in FIG. 8).

The harmonic termination resonator structure 500 is formed a different signal layer 136 of the multi-layer circuit board 108 than the power distribution network 400 and balanced power combiner 402 so as to reduce unwanted parasitic inductive or electrical coupling between the RF matching components and the harmonic termination resonator structure 500 which in turn reduces losses due to the parasitic coupling effect. The harmonic termination resonator structure 500 can have a stripline configuration as shown in FIG. 8 so as to have a well-controlled dielectric constant, meaning that the harmonic termination resonators 502, 504 have a controlled electrical length and a very precise resonance frequency. In addition, striplines are well shielded by overlying and underlying ground plane layers.

Figure 9:
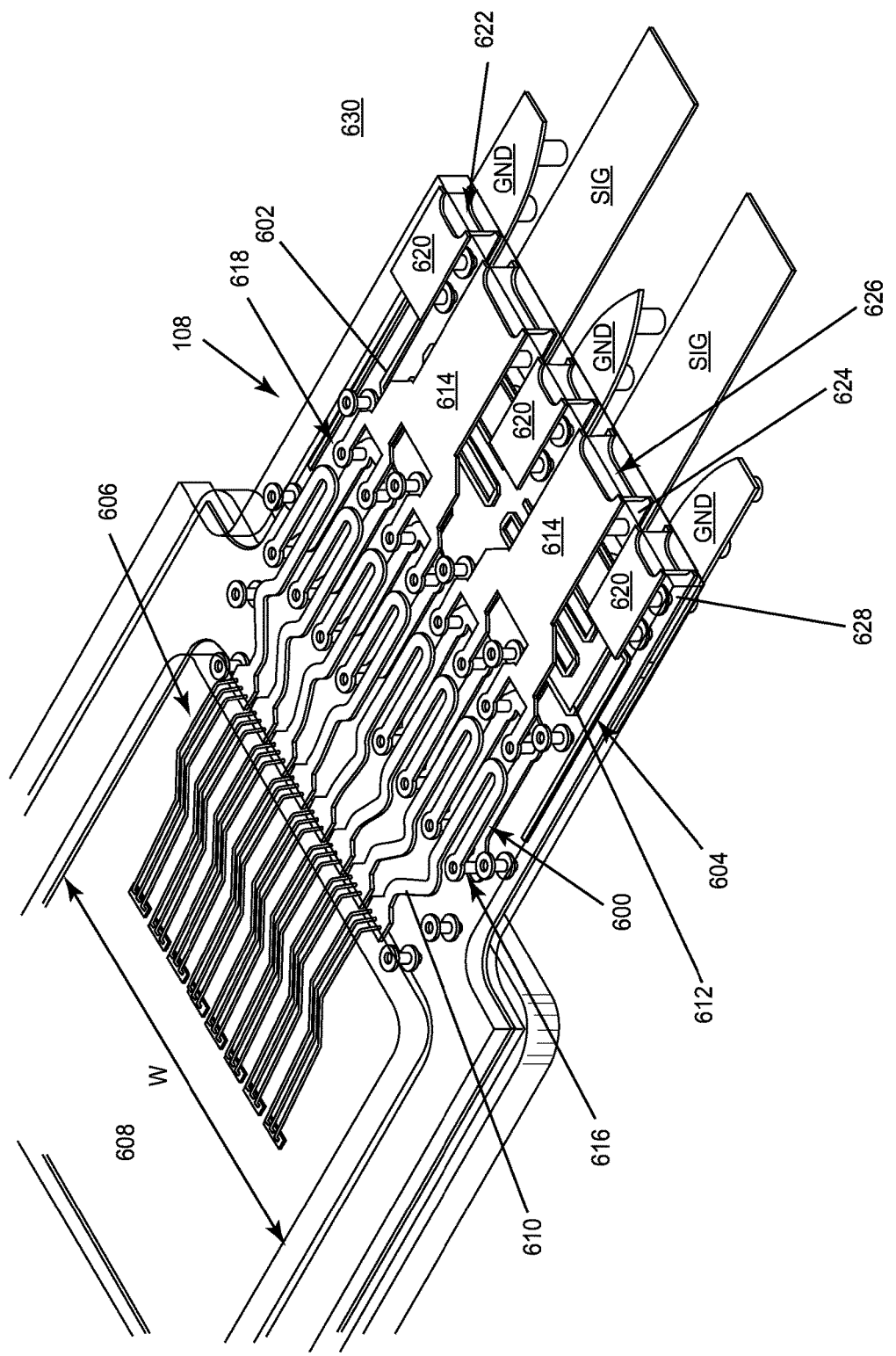
FIG. 9 illustrates a partial perspective view of a semiconductor package with a power distribution network, balanced power combiner and harmonic termination resonator formed in a multi-layer circuit board of the semiconductor package.

FIG. 9 illustrates an embodiment of the semiconductor package with a power distribution network 600, a balanced power combiner 602 and a harmonic termination resonator 604 e.g. of the kind described above, formed in the multi-layer circuit board 108 at the output side of the semiconductor package. Several electrical conductors 606 connect the RF output terminal of a semiconductor die 608 to a first plurality of signal metal tracks 610 formed in the uppermost signal layer 138 of the multi-layer circuit board 108. These signal metal tracks 610 form the power distribution network 600 which distributes power across the width (W) of the transistor die 608. An intermediary signal layer 136 disposed below the uppermost signal layer 138 comprises a plurality of signal metal tracks 612 which form the harmonic termination resonator 604.

The uppermost signal layer 138 also comprises a second plurality of signal metal tracks 614 separate from the signal metal tracks 610 which form the power distribution network 600. These additional signal metal tracks 614 of the uppermost signal layer 138 form the balanced power combiner 602. The signal metal tracks 612 of the intermediary signal layer 136 which form the harmonic termination resonator 604 are electrically connected to respective ones of the first signal metal tracks 610 which form the power distribution network 600 by a first group of insulated signal vias 616, and to respective ones of the second signal metal tracks 614 which form the balanced power combiner 602 by a second group of insulated signal vias 618. The intermediary ground layer 134 interposed between the uppermost signal layer 138 and the intermediary signal layer 136 and the dielectric material of the multi-layer circuit board 108 are not shown in FIG. 9 so that the signal metal tracks and corresponding signal vias are at least partly visible.

The uppermost signal layer 138 can further comprise a plurality of ground metal tracks 620 separate from the first and second signal metal tracks 610, 614 which form the power distribution network 600 and the balanced power combiner 602, respectively. The signal metal tracks 614 which form the balanced power combiner 602 and the ground metal tracks 620 of the uppermost signal layer 138 can be interleaved at the top side of the multilayer circuit board 108 as shown in FIG. 9. The ground metal tracks 620 of the uppermost signal layer 138 are electrically connected to the bottommost ground layer 132 at the bottom side of the multilayer circuit board 108 by insulated ground vias 622 which extend through the multilayer circuit board 108. The signal metal tracks 614 which form the balanced power combiner 602 can be electrically connected to respective signal pads 624 at the bottom side of the multilayer circuit board 108 by insulated signal vias 626 which extend through the multilayer circuit board 108. The signal pads 626 and ground pads 628 at the bottom side of the multilayer circuit board 108 are separated from and interleaved with each other. As such, the output part of the multi-layer circuit board 108 to be attached to a subsystem/system circuit board 630 can have an interleaved ground-signal-ground configuration (GND/SIG/GND/SIG/GND) e.g. as previously described herein in connection with FIGS. 3A and 3B. The subsystem/system circuit board 630 has the same interleaved ground-signal-ground configuration (GND/SIG/GND/SIG/GND) as the output side of the multi-layer circuit board 108.

Figure 10:
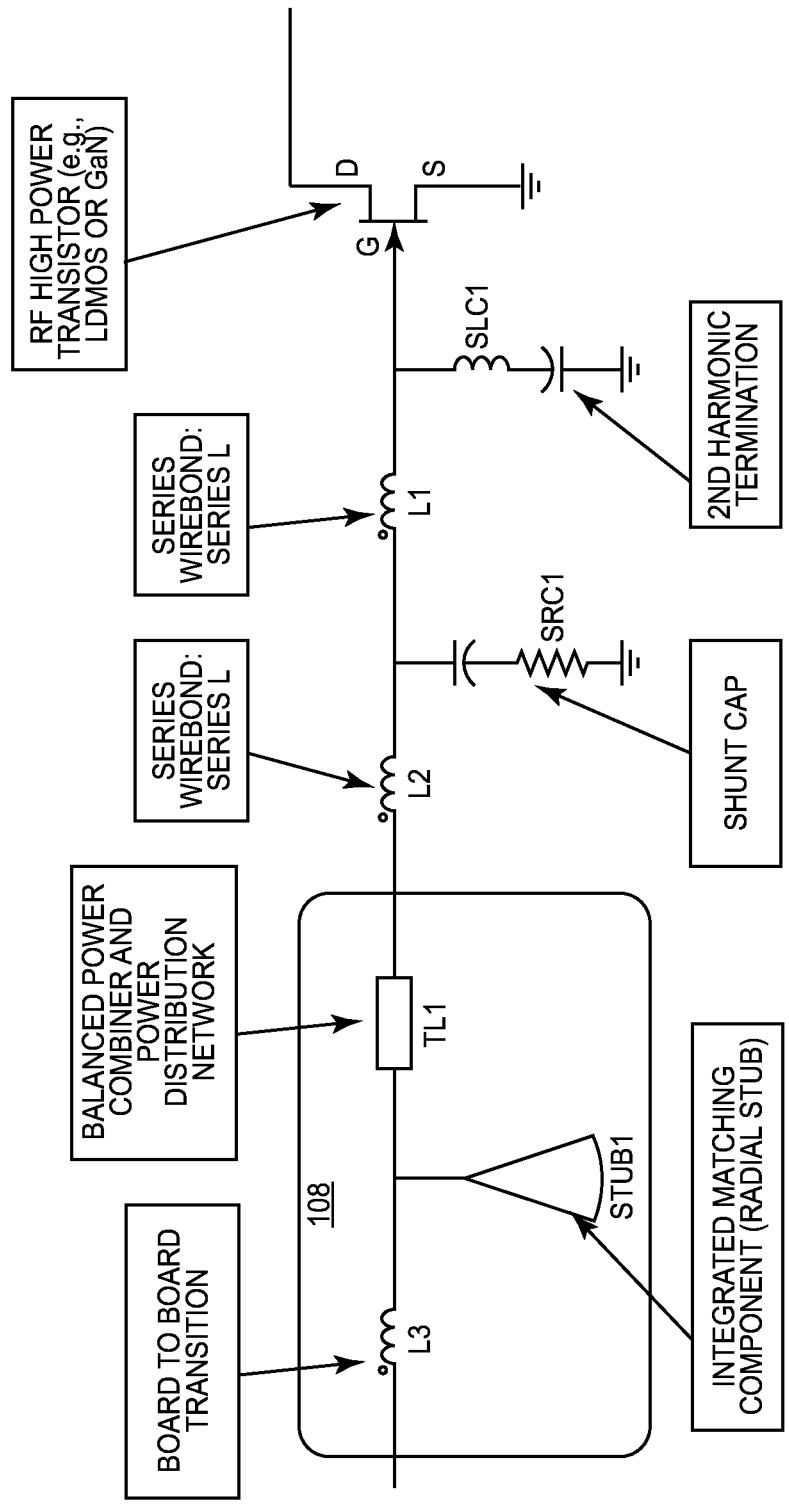
FIG. 10 illustrates a high-level schematic representation of different electrical functions at the input side of a semiconductor package having a multi-layer circuit board.

FIG. 10 illustrates a high-level representation of different electrical functions at the input side of the semiconductor package which can be incorporated into the multi-layer circuit board. A single transistor component having a source terminal (S), drain terminal (D) and gate terminal (G) is shown, which can represent one or more physical transistor dies. In this example, the source terminal of the power transistor is electrically connected to ground through the bottommost layer 132 of the multi-layer circuit board 108 and the gate terminal of the power transistor is electrically connected to the uppermost signal layer 138 of the multi-layer circuit board 108. The multi-layer circuit board 108 has one or more additional signal layers 136 interposed between the uppermost signal layer 138 and the bottommost ground layer 132. An additional ground layer 134 is interposed between each signal layer 136, 138 also as previously described herein. RF matching and power distribution and combining structures are formed in the signal layers 136, 138 of the multi-layer circuit board at the input side of the semiconductor package.

For example, an integrated matching component such as a radial stub Stub1 can be formed in an intermediary signal layer 136 below the uppermost signal layer 138 of the multi-layer circuit board 108. The integrated matching component provides impedance matching between the gate of the transistor and the subsystem/system board. The integrated impedance matching component is connected to the subsystem/system board through a transition represented by inductance L3 which corresponds to the inductance of the physical connection between the two boards. The uppermost signal layer 138 of the multi-layer circuit board 108 has a balanced power combiner and power distribution network schematically represented by transmission line TL1. The power combiner and power distribution network can be disposed in the same signal layer 138 which is different than the signal layer 136 which includes the integrated impedance matching component.

The power combiner is electrically connected to the integrated matching component at one end and to the power distribution network at the other end. The opposite end of the power distribution network is electrically connected to the gate terminal of the transistor through an input match network. The input match network includes the electrical connections to the gate terminal which are represented by series inductances L1 and L2, a shunt capacitor SRC1 and a $2^{nd}$ harmonic termination structure SLC1. The input match network can be integrated into one or more signal layers 1326, 138 of the multi-layer circuit board 108 or provided as discrete passive components e.g. such as integrated passive devices in the case of the capacitors.

Figure 11:
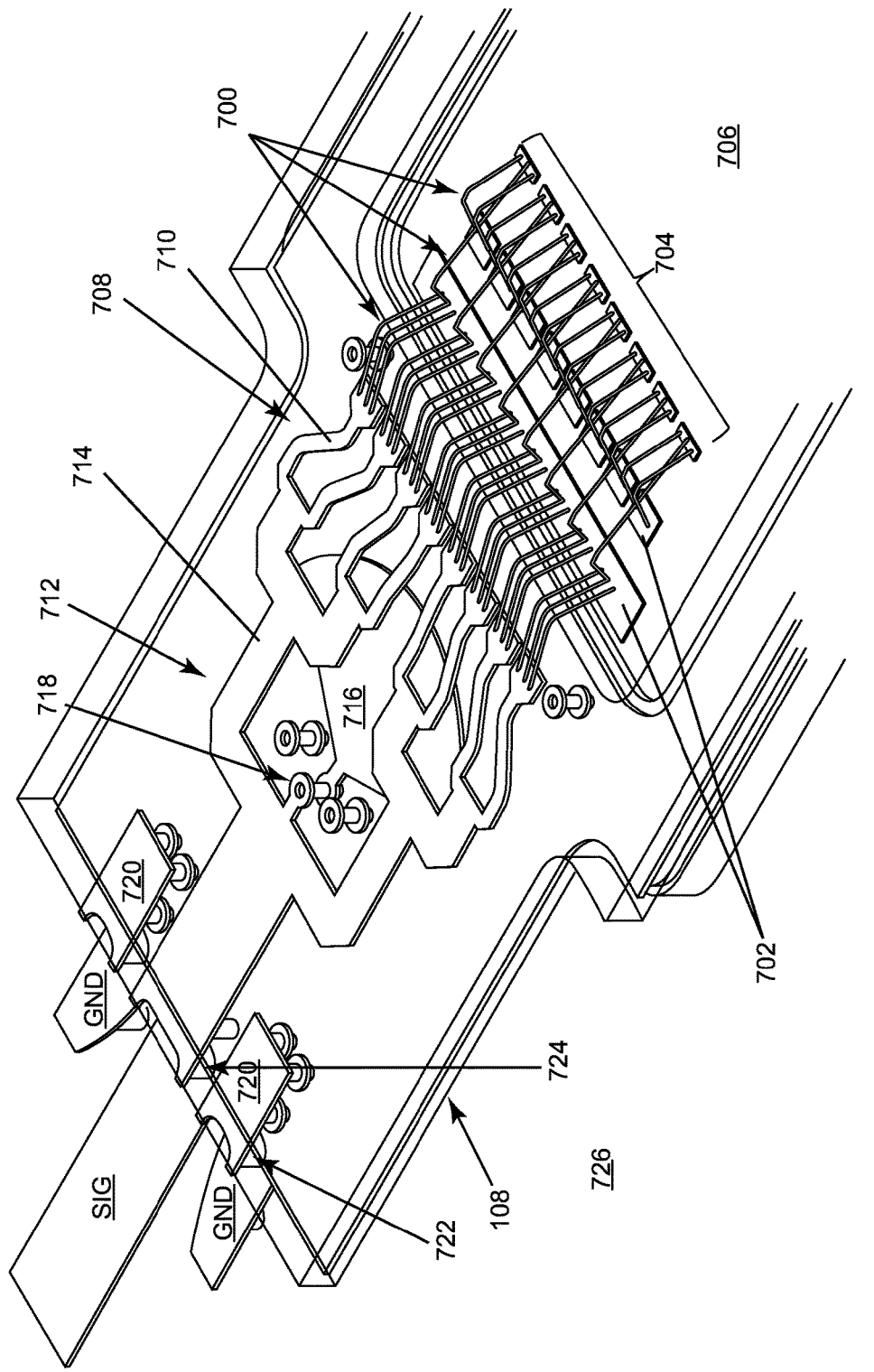
FIG. 11 illustrates a partial perspective view of a semiconductor package with RF matching and power distribution and combining structures formed in a multi-layer circuit board at the input side of the semiconductor package.

FIG. 11 illustrates an embodiment of the semiconductor package with RF matching and power distribution and combining structures e.g. of the kind previously described above in connection with FIG. 10, formed in the multi-layer circuit board 108 at the input side of the semiconductor package. The input match network is implemented as wire bond connections 700 and discrete capacitors 702 according to this embodiment. The input match network connects to the gate terminal 704 of a transistor die 706 at one end and to a power distribution network 708 at the other end. The power distribution network 708 comprises a first plurality of metal signal tracks 710 formed in the uppermost signal layer 138 of the multi-layer circuit board 108. A balanced power combiner 712 is formed by a second plurality of metal signal tracks 714 formed in the uppermost signal layer 138. An integrated impedance matching component formed as a radial stub 716 is disposed in one of the underlying intermediary signal layers 136 of the multi-layer circuit board 108. The radial stub 716 is electrically connected to respective ones of the second signal metal tracks 714 which form the balanced power combiner 712 by one or more insulated signal vias 718. The intermediary ground layer 134 interposed between the uppermost signal layer 138 and the intermediary signal layer 136 with the radial stub 716 and the dielectric material of the multi-layer circuit board 108 are not shown in FIG. 11 so that the signal metal tracks and corresponding signal vias are at least partly visible.

The uppermost signal layer 138 can further comprise a plurality of ground metal tracks 720 separate from the metal tracks 714 of the balanced power combiner 712. The balanced power combiner 712 and the ground metal tracks 720 formed in the uppermost signal layer 138 can be interleaved at the top side of the multilayer circuit board 108 as shown in FIG. 11. The ground metal tracks 720 of the uppermost signal layer 138 can be electrically connected to the bottommost ground layer 132 at the bottom side of the multilayer circuit board 108 by insulated ground vias 722 which extend through the multilayer circuit board 108. The balanced power combiner 712 is electrically connected to a signal pad at the bottom side of the multilayer circuit board 108 by insulated signal vias 724 which extend through the multilayer circuit board 108. The ground and signal pads (both out of view in FIG. 11) at the bottom side of the multilayer circuit board 108 are separated from and interleaved with each other. As such, the input part of the multi-layer circuit board 108 to be attached to a subsystem/system circuit board 726 can have an interleaved ground-signal-ground configuration (GND/SIG/GND). The subsystem/system circuit board 726 has the same interleaved ground-signal-ground configuration (GND/SIG/GND) as the input side of the multi-layer circuit board 108.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
a metal baseplate having a die attach region and a peripheral region;
a transistor die having a reference terminal attached to the die attach region and an RF terminal facing away from the baseplate; and
a multilayer circuit board having a first side attached to the peripheral region and a second side facing away from the baseplate, the multilayer circuit board comprising a plurality of interleaved signal and ground layers,
wherein a first one of the signal layers is at the second side of the multilayer circuit board and electrically connected to the RF terminal of the transistor die,
wherein a first one of the ground layers is below the first signal layer,
wherein a second one of the signal layers is below the first ground layer and electrically connected to the first signal layer by insulated vias which extend through the first ground layer,
wherein a second one of the ground layers is at the first side of the multilayer circuit board and attached to the metal baseplate.

2. The semiconductor package of claim 1, wherein:
the first signal layer comprises a first plurality of signal metal tracks electrically connected to the RF terminal of the transistor die; and
the second signal layer comprises a first plurality of signal metal tracks electrically connected to respective ones of the first plurality of signal metal tracks of the first signal layer by the insulated vias.

3. The semiconductor package of claim 2, wherein:
the first signal layer comprises a second plurality of signal metal tracks separate from the first plurality of signal metal tracks of the first signal layer; and
the first plurality of signal metal tracks of the second signal layer are electrically connected to respective ones of the first plurality of signal metal tracks of the first signal layer by a first group of the insulated vias and to respective ones of the second plurality of signal metal tracks of the first signal layer by a second group of the insulated vias.

4. The semiconductor package of claim 3, wherein:
the first signal layer comprises a plurality of ground metal tracks separate from the first and the second plurality of signal metal tracks of the first signal layer; and
the second plurality of signal metal tracks and the plurality of ground metal tracks of the first signal layer are interleaved at the second side of the multilayer circuit board.

5. The semiconductor package of claim 4, wherein the plurality of ground metal tracks of the first signal layer are electrically connected to the second ground layer at the first side of the multilayer circuit board by insulated vias which extend through the multilayer circuit board.

6. The semiconductor package of claim 3, wherein the second plurality of signal metal tracks of the first signal layer are electrically connected to respective signal pads at the first side of the multilayer circuit board by insulated vias which extend through the multilayer circuit board.

7. The semiconductor package of claim 6, further comprising ground pads at the first side of the multilayer circuit board which are separated from and interleaved with the signal pads.

8. The semiconductor package of claim 1, wherein the first ground layer comprises a single metal sheet interposed between the first signal layer and the second signal layer.

9. The semiconductor package of claim 1, wherein a harmonic termination resonator is formed in the second signal layer and configured to capture spurious harmonics present in a signal at the RF terminal of the transistor die.

10. The semiconductor package of claim 1, wherein an impedance transformation network is formed in the second signal layer and configured to transform a lower impedance at the RF terminal of the transistor die to a higher impedance.

11. The semiconductor package of claim 10, wherein the impedance transformation network comprises a radial stub formed in the second signal layer.

12. The semiconductor package of claim 1, wherein:
the first signal layer comprises a power combiner and a plurality of metal tracks;

the metal tracks are electrically connected in parallel to the RF terminal of the transistor die at a first end of the metal tracks;

the metal tracks are connected to the power combiner at a second end of the metal tracks opposite the first end; and the power combiner is configured to distribute current equally in amplitude and phase at each metal track.

13. The semiconductor package of claim 1, wherein the second ground layer comprises ground pads and signal pads, wherein the ground pads are attached to the metal baseplate and extend beyond an exterior sidewall of the baseplate and are configured for attachment to another circuit board, and wherein the signal pads are spaced apart from the ground pads and positioned beyond the exterior sidewall of the baseplate and also configured for attachment to the same circuit board as the ground pads.

14. The semiconductor package of claim 13, wherein the ground pads are electrically connected to each ground layer of the multilayer circuit board by insulated ground vias which extend at least partly through the multilayer circuit board, and wherein the signal pads are electrically connected to each signal layer of the multilayer circuit board by insulated signal vias which extend at least partly through the multilayer circuit board.

15. The semiconductor package of claim 1, wherein the ground layers are electrically connected to one another by insulated ground vias which extend at least partly through the multilayer circuit board.

16. A semiconductor package, comprising:
a metal baseplate;
a semiconductor die having a reference terminal attached to the baseplate and an RF terminal facing away from the baseplate;
a multilayer circuit board having a first side attached to the baseplate and a second side facing away from the baseplate, the multilayer circuit board comprising a plurality of interleaved signal and ground layers, one of the signal layers being at the second side of the multilayer circuit board and electrically connected to the RF terminal of the semiconductor die, one of the ground layers being at the first side of the multilayer circuit board and attached to the metal baseplate;
power distribution structures formed in the signal layer at the second side of the multilayer circuit board; and
RF matching structures formed in a different one of the signal layers than the power distribution structures.

17. The semiconductor package of claim 16, further comprising power combining structures formed in the signal layer at the second side of the multilayer circuit board and separate from the power distribution structures, wherein the power distribution structures are electrically connected to the power combining structures through the RF matching structures.

18. The semiconductor package of claim 17, wherein the power combining structures are electrically connected to respective signal pads at the first side of the multilayer circuit board by insulated vias which extend through the multilayer circuit board.

19. The semiconductor package of claim 18, further comprising ground pads at the first side of the multilayer circuit board which are electrically connected to the ground layers of the multilayer circuit board and interleaved with the signal pads.

20. A semiconductor assembly, comprising:
a substrate; and
a semiconductor package attached to the substrate and comprising:
a metal baseplate;
a semiconductor die having a reference terminal attached to the baseplate and an RF terminal facing away from the baseplate;
a multilayer circuit board having a first side attached to the baseplate and a second side facing away from the baseplate, the multilayer circuit board comprising a plurality of interleaved signal and ground layers, one of the signal layers being at the second side of the multilayer circuit board and electrically connected to the RF terminal of the semiconductor die, one of the ground layers being at the first side of the multilayer circuit board and attached to the metal baseplate;
power distribution structures formed in the signal layer at the second side of the multilayer circuit board; and
RF matching structures formed in a different one of the signal layers than the power distribution structures.

21. The semiconductor assembly of claim 20, wherein the ground layer at the first side of the multilayer circuit board comprises:
a first group of ground pads attached to the metal baseplate;
a second group of ground pads positioned beyond an exterior sidewall of the baseplate and attached to a first metallization of the substrate; and
a group of signal pads positioned beyond the exterior sidewall of the baseplate and attached to a second metallization of the substrate.

22. The semiconductor assembly of claim 20, further comprising power combining structures formed in the signal layer at the second side of the multilayer circuit board and separate from the power distribution structures, wherein the power distribution structures are electrically connected to the power combining structures through the RF matching structures.

23. The semiconductor assembly of claim 22, wherein:
the power combining structures are electrically connected to respective signal pads at the first side of the multilayer circuit board by insulated vias which extend through the multilayer circuit board; and
the signal pads are attached to a first metallization of the substrate.

24. The semiconductor assembly of claim 23, further comprising ground pads at the first side of the multilayer circuit board, wherein:
the ground pads are electrically connected to the ground layers of the multilayer circuit board and interleaved with the signal pads; and
the grounds pads are attached to a second metallization of the substrate.

* * * * *